(12) United States Patent
Xiao et al.

(10) Patent No.: US 9,159,567 B1
(45) Date of Patent: Oct. 13, 2015

(54) REPLACEMENT LOW-K SPACER

(71) Applicant: GLOBALFOUNDRIES Inc., Grand Cayman (KY)

(72) Inventors: Changyong Xiao, Mechanicville, NY (US); Hoong Shing Wong, Hsinchu (TW); Deepasree Konduparthi, Clifton Park, NY (US); Rohit Pal, Mechanicville, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/259,497

(22) Filed: Apr. 23, 2014

(51) Int. Cl.
*H01L 21/336* (2006.01)
*H01L 21/28* (2006.01)

(52) U.S. Cl.
CPC ............................ *H01L 21/28123* (2013.01)

(58) Field of Classification Search
CPC ................... H01L 29/66545; H01L 29/66553

USPC .................. 438/301, 303, 287, 183, 184; 257/E21.19, E29.255

See application file for complete search history.

(56) References Cited

U.S. PATENT DOCUMENTS

| 2006/0091432 | A1* | 5/2006 | Guha et al. | 257/288 |
| 2007/0045753 | A1* | 3/2007 | Pae et al. | 257/410 |
| 2012/0248508 | A1* | 10/2012 | Ponoth et al. | 257/288 |
| 2013/0049142 | A1* | 2/2013 | Liu et al. | 257/412 |

* cited by examiner

*Primary Examiner* — Julia Slutsker
(74) *Attorney, Agent, or Firm* — Heslin Rothenberg Farley & Mesiti P.C.; Victor A. Cardona, Esq.

(57) ABSTRACT

A method includes providing a gate structure having a dummy gate, a first spacer along a side of the gate. The dummy gate and the spacer are removed to expose a gate dielectric. A second spacer is deposited on at least one side of a gate structure cavity and a top of the gate dielectric. A bottom portion of the second spacer is removed to expose the gate dielectric and the gate structure is wet cleaned.

12 Claims, 8 Drawing Sheets

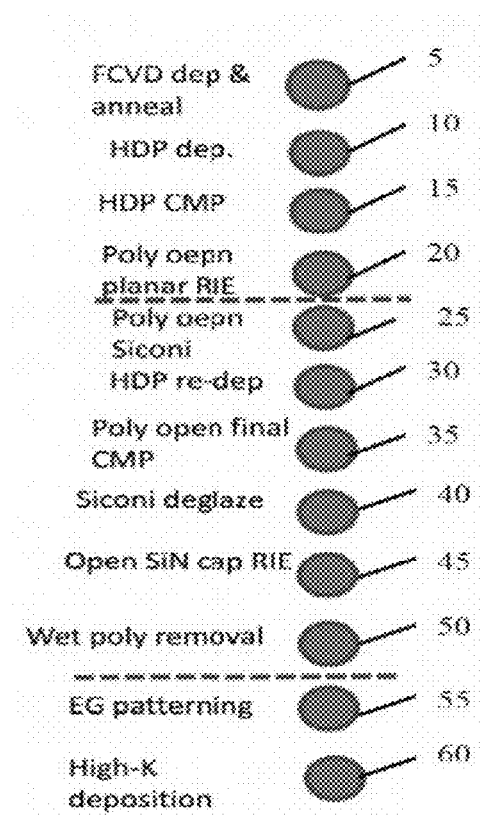
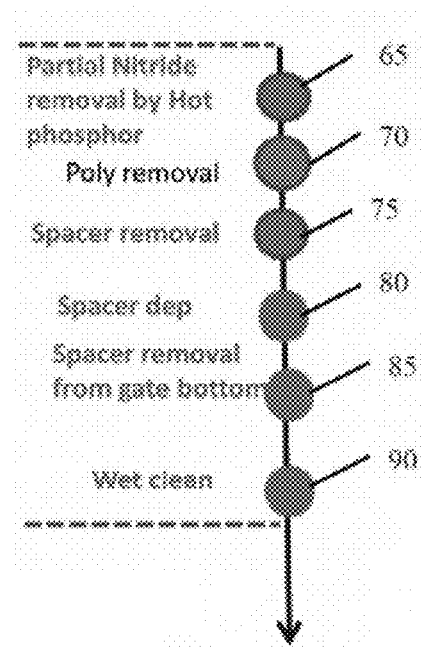
FIG. 2                          FIG. 3

REPLACEMENT LOW-K SPACER

FIELD OF THE INVENTION

The present invention generally relates to semiconductor devices and methods of fabricating semiconductor devices, and more particularly, to methods of fabricating gate structures for semiconductor devices.

BACKGROUND OF THE INVENTION

A finished gate structure (such as a finished gate or transistor gate) is the transistor terminal that modulates channel conductivity. Two principle approaches for forming semiconductor device gate structures are the gate-first and gate-last process approaches.

During fabrication of gate structures for, for instance, complementary metal-oxide-semiconductor (CMOS) technology, gate-first fabrication has traditionally been employed. In a gate-first fabrication approach, a conductor is provided over a gate dielectric, and then patterned (i.e., etched) to form one or more gate structures. After forming the gate structures, source and drain features of the semiconductor devices are provided.

More recently, the gate-last approach (or replacement metal gate (RMG) approach), has been employed. In the gate-last approach, a sacrificial (or dummy) gate material is provided and patterned (i.e., etched) to define one or more sacrificial gates. Some or all of the sacrificial gates are subsequently replaced with, for instance, a metal gate, after source and drain features of the devices have been formed. The sacrificial gate material holds the position for the subsequent metal gate to be formed. For instance, an amorphous silicon (a-Si) or polysilicon sacrificial gate may be patterned and used during initial processing until high-temperature annealing to activate the source and drain features has been completed. Subsequently, the a-Si or polysilicon may be removed and replaced with the final metal gate. Further, a semiconductor technology node scales down to nano-scale regime, it requires the parasitic capacitances to be small to improve device AC performance. The large parasitic capacitance associated with spacers is one of the key dielectrics which may degrade transistor performance. A Low-K spacer is a good candidate to minimize parasitic capacitance for high performance CMOS technology, and there may be less of an impact to the properties thereof induced by downstream processes In general, total overlap capacitance (Cov) consists of three components: direct overlap capacitance (Cdo), outer fringing capacitance (Cof), and inner fringing capacitance (Cif). As a channel length shrinks, the distances between a gate electrode to source/drain and contact fields also scale down and the direct effect is Cof becomes more prominent.

Accordingly, a need exists for improved systems and methods for forming semiconductor device gate structures to reduce parasitic losses.

BRIEF SUMMARY

The shortcomings of the prior art are overcome and advantages are provided through the provision, in one aspect, of a method which includes providing a gate structure having a dummy gate and a first spacer along each side of the dummy gate. The dummy gate and the first spacer are removed to expose a gate dielectric. A second spacer is deposited on at least one side of a gate structure cavity and a top of the gate dielectric. A bottom portion of the second spacer is removed to expose the gate dielectric and the gate structure is wet cleaned.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 2 is a flow chart of process for replacement metal gate formation;

FIG. 3 is a flow chart of a the process for replacement metal gate formation in accordance with the present invention;

DETAILED DESCRIPTION

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions, and/or arrangements within the spirit and/or scope of the underlying inventive concepts will be apparent to those skilled in the art from this disclosure.

Figure 1:
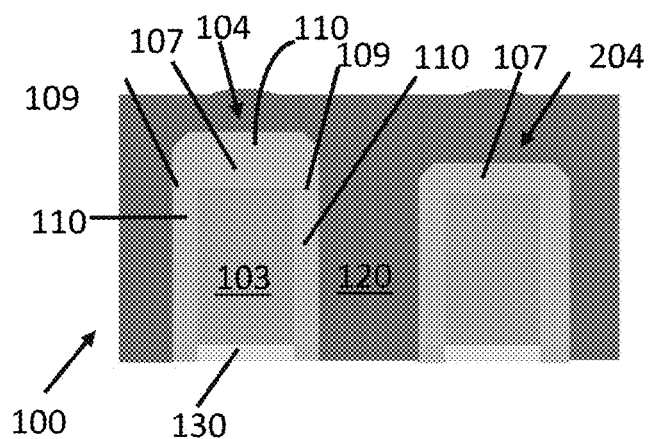
FIG. 1 is a partial elevational view of an example of a intermediate structure obtained after contact source/drain formation, followed by a FCVD step of a semiconductor fabrication process, in accordance with one or more aspects of the present invention.

As illustrated in FIG. 1, an intermediate structure 100 obtained during gate-last fabrication of a semiconductor device, such as a semiconductor device comprising multiple MOSFETs, after a poly open chemical mechanical planarization is depicted. Intermediate structure 100 includes a substrate (not shown), which may be a silicon substrate. A gate structure 104 is illustrated, which includes an amorphous silicon dummy gate 103 surrounded on three sides by a spacer 110 which may be made of silicon nitride, a low-k nitride material or could be a hybrid spacer formed of nitride, oxide/nitride, or low-K/oxide/low-K. A gate isolation 120 may be formed of an oxide, flowable oxide, or flowable oxide and topped with oxide, for example, and such gate isolation may separate gate structure 104 from a second gate structure 204.

Figure 1A:
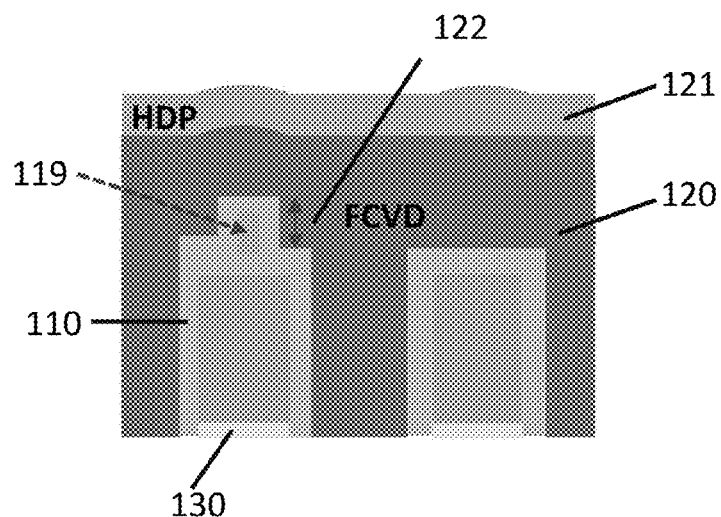
FIG. 1A depicts the gate structure of FIG. 1 after a HDP step.
Figure 1B:
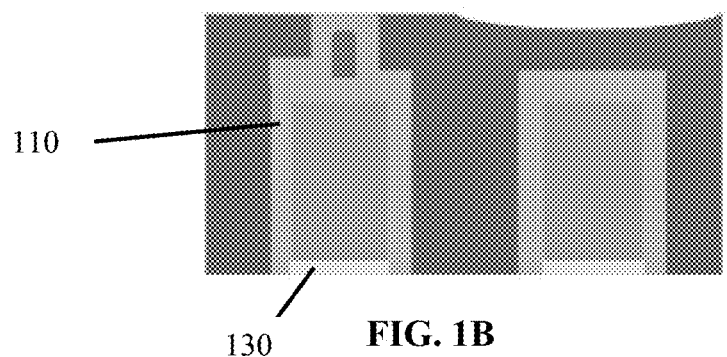
FIG. 1B depicts the gate structure of FIG. 1A after a chemical mechanical planarization step (e.g., HDP CMP)
Figure 1C:
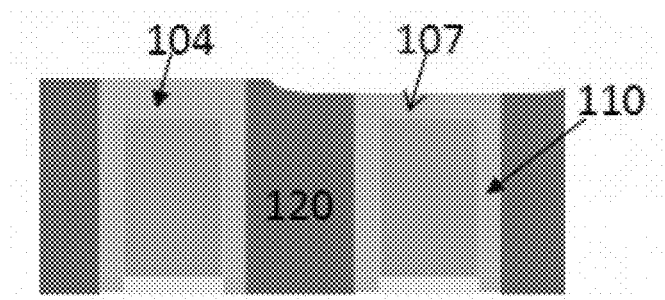
FIG. 1C depicts the gate structure of FIG. 1B after a poly open etch.

A process for replacement metal gate formation after a gate stack formation and prior to work-function metal deposition is depicted in a flow chart of FIG. 2. In particular, flowable chemical vapor deposition (FVCD) of silicon oxide to form isolation 120 between dummy gate 103 and annealing of FCVD oxide 120 are performed in step 5 followed by high density plasma deposition of an oxide 121 in step 10 (FIG. 1A). Chemical mechanical planarization polish (CMP) of oxide 121 and oxide 120 is performed in step 15, which stops on a nitride 119 of bump 122 (e.g., an upward projection of a top portion of a nitride spacer in gate 104), as shown by FIG. 1B. FIGS. 1A and 1B depict an oxide or nitride 119 within spacer 110 that provides etch selectively (e.g., in junction modules for nFET and PFET patterning). Poly open non-selective etch for the planarization (e.g., via reaction ion etching) of bump 122 is performed in step 20 (FIG. 1C).

Figure 1D:
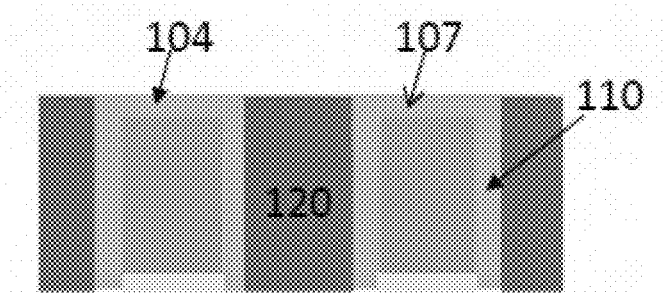
FIG. 1D depicts the gate structure of FIG. 1C after a final chemical mechanical planarization step.

Further steps for replacement metal gate formation are laid out in steps 25 to 50 as depicted in FIG. 2, and described below. In step 25, a typical process of SiCoNi (i.e., a type of dry etching process) is used to recess the isolation (e.g., isolation 120) between dummy gates (e.g. gate 103). The SiCoNi process includes dry cleaning or deglazing, e.g, a dry etch for removing oxide with good selectivity to nitride. A wet etching process could be used in place of the SiCoNi process. In the following step 30, high density plasma oxide is re-deposited. Poly open CMP for the better formation of a better flat surface in step 35 stops on the nitride as depicted in FIG. 1D. SiCoNi deglazing in step 40 removes any possible remaining oxide residue on the nitride. Access to the dummy gate is again opened where the nitride on the gate is etched away via reactive ion etching in step 45. The dummy poly silicon gate is then removed in step 50 using wet etching (e.g. using TMATH (Tetra Methyl Ammonium Hydroxide), or ammonia).

These steps are followed by EG patterning to expose a fresh Si gate in a thin gate area, i.e. remove a thick gate dielectric from a thin gate area in step 55. Thin gate dielectric oxide growth and High-k (typically HfO2, etc) deposition of a gate occurs in step 60, which are part of a rear metal gate process typically.

In an embodiment of the present invention, steps 25-50 of the typical process described above relative to FIG. 2 are replaced by steps 65-90 laid out in a flow chart of FIG. 3. The process represented in FIG. 3 can start either after step 20 or after step 40 for a trade-off of cost and margin robustness.

Figure 4:
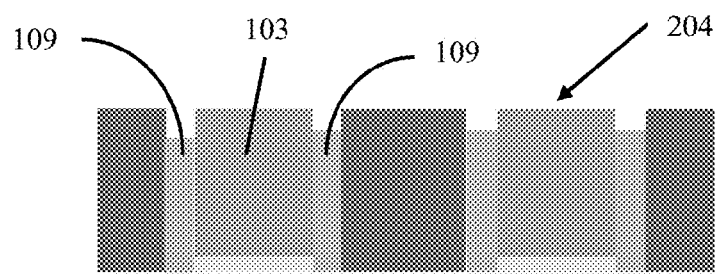
FIG. 4 depicts the intermediate gate structure of FIG. 1 after removal of a portion of a first spacer.
Figure 5:
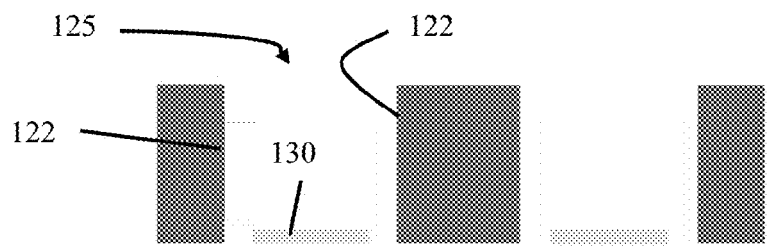
FIG. 5 depicts the intermediate gate structure of FIG. 4 after the removal of a dummy gate and a remaining portion of the spacer of FIG. 4.

One or more process operations (e.g., a hot phosphorous, wet or dry etching) may be performed to remove a top horizontal side 107 and top portions of vertical sides 109 of spacer 110 as depicted in FIG. 4 (step 65 of FIG. 3). Gate 103 and remaining portions of sides 109 may then be removed to expose a gate dielectric 130 at a bottom of gate structure 104 and to result in a cavity 125 bounded on opposite lateral sides by vertical sides 122 of gate isolation 120 as depicted in FIG. 5 (steps 70 and 75 of FIG. 3). For example, horizontal sides 107 and vertical side 109 of spacer 110 and gate 103 may be removed by wet chemical or dry etch process, or the combination of wet and dry etch, such as reactive ion etching using fluorine-based chemistry involving process gases such as tetrafluoromethane (CF4), trifluoromethane (CHF3), sulfur hexafluoride (SF6), nitrogen triflouride (NF3) etc, and wet removal by hot phosphorous. In one example, an intermediate gate structure may include a spacer therein having a vertical side (e.g., vertical sides 109), but not a horizontal side 104 and 204. Also, the above described spacer (e.g. side 109, and spacer 110) may have already been modified by steps of implantation and thermal annealing in junction formation.

Figure 6:
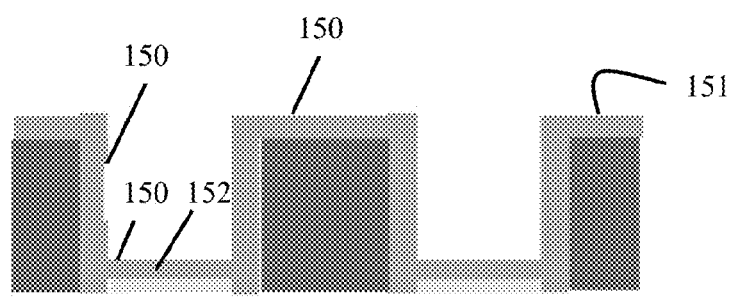
FIG. 6 depicts the intermediate gate structure of FIG. 5 after a fresh spacer has been deposited.
Figure 7:
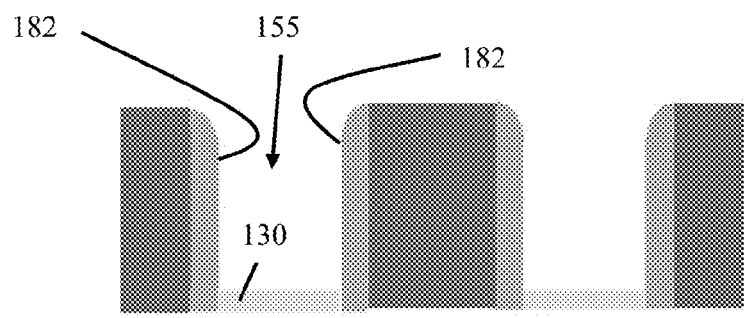
FIG. 7 depicts the intermediate gate structure of FIG. 6 after a removal of a bottom of the fresh spacer of FIG. 6.

A fresh or second spacer 150 may be deposited on gate structure 104 via atomic layer deposition (ALD), chemical vapor deposition, or physical vapor deposition as depicted in FIG. 6 (step 80 of FIG. 3) where high uniformity and very good coverage is required. The new spacer (e.g., second spacer 150) could be a low K nitride spacer (e.g. SiOCN, SiCN, or low K nitride sandwiched Low-k nitride/oxide/Low-K nitride) or a normal spacer (e.g., Si3N4 or hybrid spacer of nitride sandwich as nitride/oxide/nitride) spacer being void-free A top portion 151 and a bottom portion 152 of second spacer 150 may be removed (e.g., wet etching, dry etching or hot phosphorus etching, or mixing of them) to expose gate dielectric 130 as depicted in FIG. 7 (Step 85 of FIG. 3). Plasma etching may further be utilized to remove bottom portion 152. A wet clean (e.g., typical wet process being hot SPM, diluted SPM, or ultra diluted SPM, or ultra diluted SPM, SC1 or mixed use of these steps) may be performed as indicated in step 90 of FIG. 3 such as a wet clean process. Also, such a wet clean step and poly removal step may be combined into a single step process. A cavity 155 may be bounded by gate dielectric 130 and vertical sides 182 of spacer 150.

Figure 8:
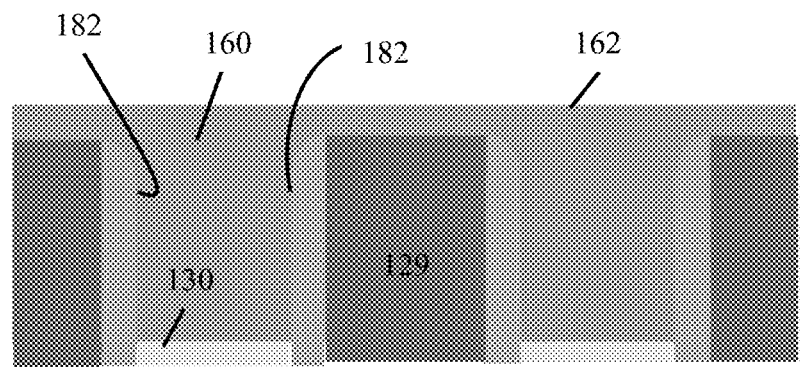
FIG. 8 depicts the intermediate gate structure of FIG. 7 after a deposition of a metal gates.
Figure 9:
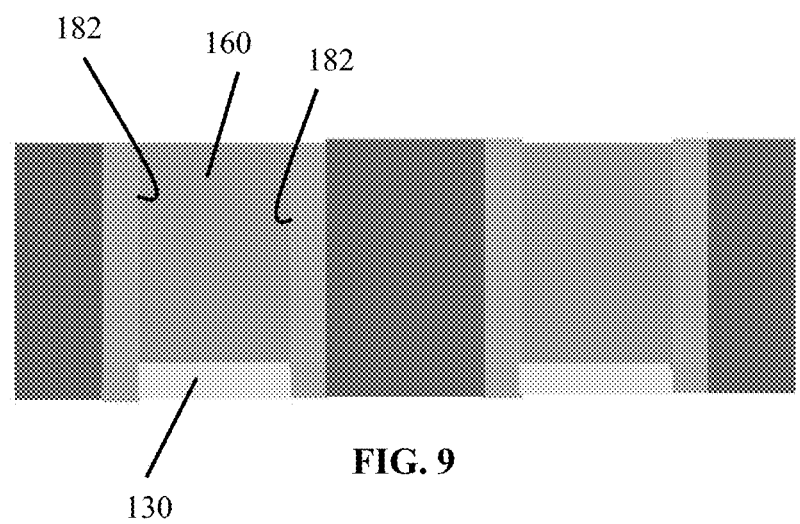
FIG. 9 depicts the intermediate gate structure of FIG. 8 after a planarization of the gate of FIG. 8.

Metal may be deposited in cavity 155 to form a metal gate 160 as depicted in FIG. 8 and chemical mechanical planarization may be performed to result in a top portion 162 of gate 160 being removed as depicted in FIG. 9. This process may also allow loose gate height control. In particular, the described process utilizes a fresh spacer to form a successive spacer sidewall, which contrasts with the prior art process requiring a higher gate height and therefore longer gate CMP to avoid gates being formed too short (please refer to below figures.)

Figure 10:
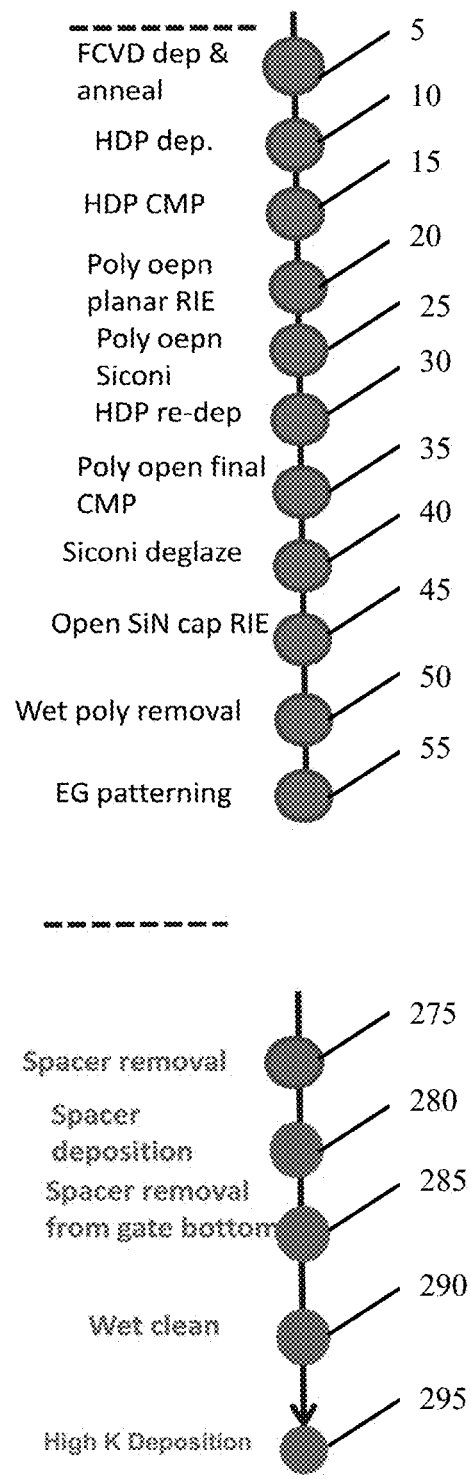
FIG. 10 depicts a flow chart of an alternative embodiment of a method for replacing a gate structure in accordance with the present invention.

In an alternate embodiment, steps 5 to 55 (FIG. 2) may be performed followed by steps 275 to 290, which are identical to steps 75 to 90 (FIG. 3) described above, as illustrated in FIG. 10 A high-K gate dielectric deposition of a gate is performed in step 295 which is identical to step 60 described above.

Figure 11:
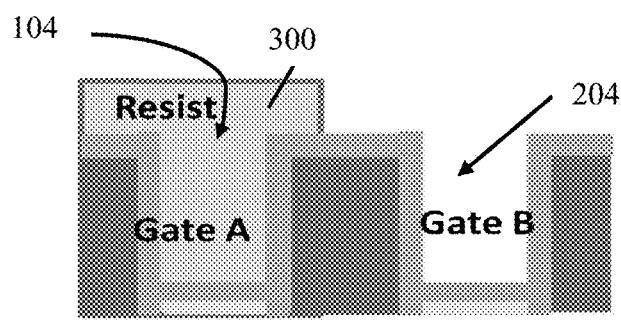
FIG. 11 depicts the intermediate gate structure of FIG. 6 after a resist is applied to the first gate of the structure.
Figure 12:
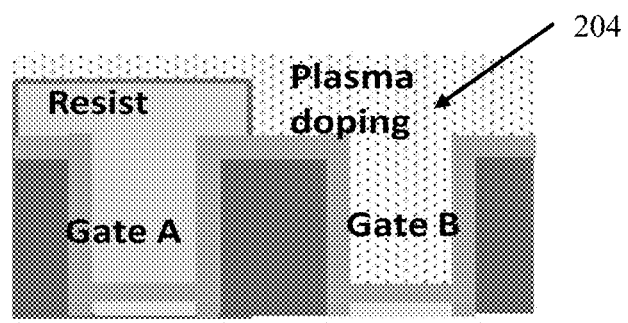
FIG. 12 depicts the intermediate gate structure of FIG. 12 after a plasma doping of a second gate of the gate structure.
Figure 13:
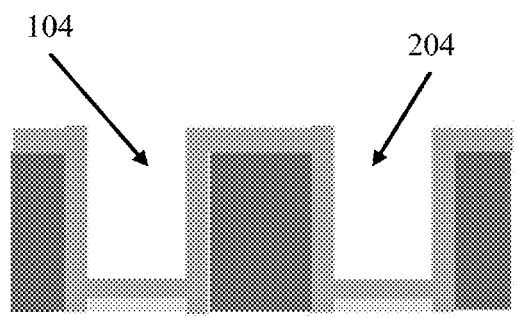
FIG. 13 depicts the intermediate gate structure of FIG. 12 after removal of the resist.
Figure 14:
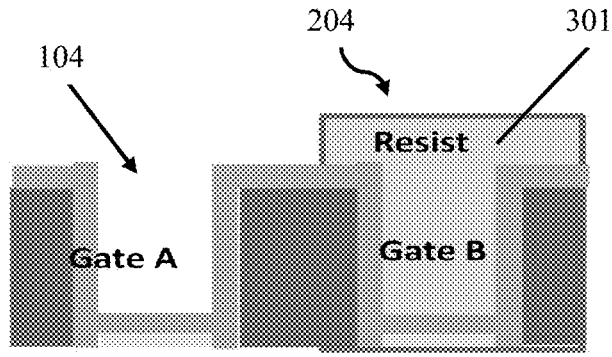
FIG. 14 depicts an application of a resist to the second gate of the gate structure of gate 13.
Figure 15:
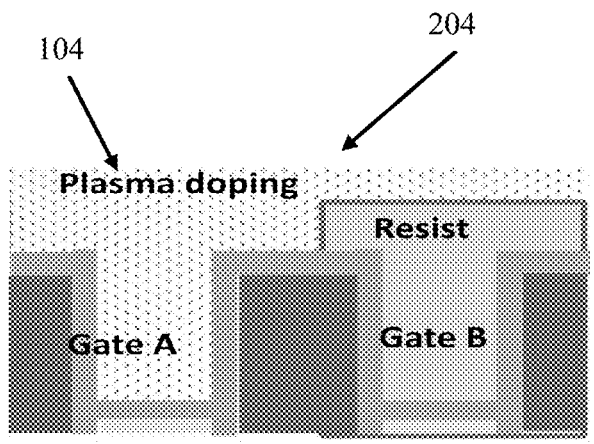
FIG. 15 depicts plasma doping of the first gate of the gate structure of FIG. 14.
Figure 16:
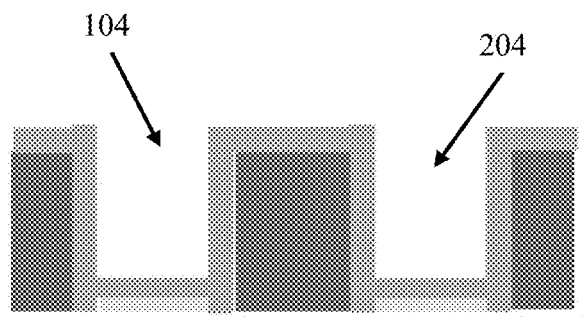
FIG. 16 depicts the intermediate gate structure of FIG. 15 after removal of the resist of the second gate.

In a further embodiment, a stress modification may be performed after step 75 and 275 described above and before steps 80 and 280, respectively. In particular, as depicted in FIG. 11, gate structure 104 is adjacent second gate structure 204. A resist 300 is applied to gate structure 104 as depicted in FIG. 12, and plasma doping is performed on gate structure 204. FIG. 13 depicts the stripping of resist 300 leaving gate structure 204 doped. As depicted in FIG. 14, a resist 301 is applied to gate structure 204 and plasma doping is performed on gate structure 104 as depicted in FIG. 15. FIG. 16 depicts the stripping of resist 300 leaving gate structure 204 doped. The plasma doping of the gate structures provides a stress exert on a channel of the gate structure both of the sidewalls and channel to boost devices performance of nFET and pFET respectively under different annealing treatment or combined with variation of doping temperature, dose, etc. This presents a feasible way to separately treat nFET and pFET but with less-intervention thereof. Traditional SMT (stress memory technology) always sacrifices one type of device or requires a patterning method to cover nFET and pFET with films of different stress. As indicated above, following such a stress exert, steps 85 and 90 from the flow chart illustrated in FIG. 3, or identical steps 285 and 290 (FIG. 10) may be performed. The above described doping may be done using doping elements N, C, Si, H, deuterium, B, etc. Those common used dopants like B, P, As in this way can also work as dopant resource to a certain extent beside the stress modification.

The above described method allows the formation of a fresh spacer dielectric with minimum thermal budget, less modification to spacer material properties from implantation, a maximum maintenance of material properties of a low-k spacer and the provision of easily achieved void-free spacers, as the original spacers experience two times stronger spacer etch, and the subsequent two times strong wet etch for more than 30 nm Si recess, many times implantation and associated patterning treatment for halo & extension.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method, comprising:
    providing a gate structure having a dummy gate, and a first spacer along a side of the dummy gate;
        removing the dummy gate and the first spacer to expose a gate dielectric;
        depositing a second spacer on at least one side of a gate structure cavity and a top of the gate dielectric;
        removing a bottom portion of the second spacer to expose the gate dielectric;
        wet cleaning the gate structure; and
        exerting stress on the gate structure after the depositing the second spacer and before the removing the bottom portion of the second spacer.

2. The method of claim 1 further comprising depositing a metal gate on the gate structure.

3. The method of claim 2 further comprising performing metal polishing of the gate structure.

4. The method of claim 1 wherein the removing the dummy gate and first spacer comprises EG patterning of the gate structure and removing the first spacer.

5. The method of claim 1 wherein the removing the dummy gate and the first spacer comprises removing the first spacer after a gate stack formation.

6. The method of claim 1 further comprising removing a portion of the first spacer prior to the removing a remainder of the first spacer.

7. The method of claim 6 wherein the removing the portion comprises removing the portion by hot phosphor removal.

8. The method of claim 1 wherein the exerting stress comprises applying a resist to the gate structure and performing plasma doping on a second gate structure adjacent the first gate structure.

9. The method of claim 8 further comprising stripping the resist.

10. The method of claim 9 further comprising applying a second resist to the second gate structure and performing plasma doping on the first gate structure.

11. The method of claim 10 further comprising stripping the second resist.

12. The method of claim 1, wherein the first spacer comprises a top spacer portion on a top of the dummy gate.

\* \* \* \* \*